(12) United States Patent
Silva (10) Patent No.: US 7,987,581 B2
(45) Date of Patent: Aug. 2, 2011

(54) HIGH POWER MANUFACTURING FRIENDLY TRANSFORMER

(75) Inventor: Arturo Silva, Allen, TX (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 12/474,149

(22) Filed: May 28, 2009

(65) Prior Publication Data

US 2009/0295527 A1    Dec. 3, 2009

Related U.S. Application Data (60) Provisional application No. 61/056,706, filed on May 28, 2008.

(51) Int. Cl.
*H01F 7/06* (2006.01)

(52) U.S. Cl. ........ 29/602.1; 336/188; 336/208; 336/189

(58) Field of Classification Search .................. 29/602.1
See application file for complete search history.

(56) References Cited

U.S. PATENT DOCUMENTS

| | | | | |
|---|---|---|---|---|
| 3,649,939 A * | 3/1972 | Hildebrandt | .................... | 336/65 |
| 3,812,443 A * | 5/1974 | Schroeder | .................... | 336/192 |
| 6,411,528 B1 * | 6/2002 | Yasumura | ........................ | 363/19 |
| 6,690,257 B2 * | 2/2004 | Kobayashi et al. | ............ | 336/229 |
| 6,794,976 B2 * | 9/2004 | Sigl | ................................ | 336/170 |
| 6,879,235 B2 * | 4/2005 | Ichikawa | ........................ | 336/200 |
| 7,317,374 B2 * | 1/2008 | Flanders et al. | ............... | 336/220 |
| 7,564,335 B1 * | 7/2009 | Yang | .............................. | 336/192 |
| 2004/0183642 A1 * | 9/2004 | Suzui | ............................ | 336/192 |
| 2006/0018134 A1 * | 1/2006 | Tsuruya | ..................... | 363/21.04 |
| 2009/0144967 A1 * | 6/2009 | Hasu et al. | ....................... | 29/605 |

FOREIGN PATENT DOCUMENTS

JP    2002208520 A  *  7/2002

* cited by examiner

*Primary Examiner* — Anh T Mai
(74) *Attorney, Agent, or Firm* — Marsh Fischmann & Breyfogle LLP

(57) ABSTRACT

Transformers having bobbins that are constructed in such a way that pre-formed secondary windings (e.g., resembling springs) may be slipped onto the bobbins after a primary winding has been wound onto the bobbin. Additionally, the secondary windings may also serve as a self-leading device. That is, they may not require terminations on pins of the bobbin, which may reduce cost and complexity. The secondary windings may have circular or non-circular (e.g., flat) cross-sections. The transformer winding techniques provided herein may reduce the number of components, and may promote smaller input filters and/or less filtering stages at a fraction of the cost of conventional transformers.

11 Claims, 8 Drawing Sheets

HIGH POWER MANUFACTURING FRIENDLY TRANSFORMER

CROSS-REFERENCE TO RELATED APPLICATION

This application claims priority under 35 U.S.C. 119 to U.S. Provisional Application No. 61/056,706, entitled: "TECHNIQUES FOR POWER CONVERSION," filed on May 28, 2008, the contents of which are incorporated herein as if set forth in full.

BACKGROUND

Generally, magnetic components use magnetic materials for shaping and directing magnetic fields in a manner designed to achieve a desired electrical performance. Magnetic components are readily used in a wide variety of electronic equipment such as computers, televisions, telephones, etc. In operation, magnetic fields may act as the medium for storing, transferring, and releasing electromagnetic energy. Transformers are one specific example of a magnetic component, and typically comprise two or more windings of conductors (e.g., copper wire) wound around a bobbin with a magnetic core inserted through the bobbin. The bobbin may generally be made of a molded plastic or any other suitable dielectric material. The conductors may be wound around the bobbin a predetermined number of times and in a predetermined configuration to achieve specific electrical characteristics. For example, the number of windings (e.g., a primary winding and a secondary winding) and the number of turns for the conductors in each winding may be a function of the intended application for the transformer.

To form the magnetic field in the transformer, a core assembly having high magnetic permeability may be inserted into the bobbin. Often the core assembly is made in two pieces, each having an "E" shaped cross-section that may be inserted into opposite ends of the bobbin. The transformer assembly may then be held together by various physical means such as a spring clip, tape, or an adhesive. Of course, different configurations may also be used for various applications.

Transformers generally operate on the principle that a change in current flowing through a first winding conductor, which is isolated from a second winding conductor, creates a magnetic flux in a core that causes a change in the current flow in the second winding conductor. The ratio of current in the two winding conductors may generally be related to the relative number of windings of each conductor. This may in turn create a voltage that may be the product of the number of turns multiplied by the change in magnetic flux.

Transformers are used in several applications, including power converters (or power adapters) used to power electronic devices, such as cell phones, computers, and the like. One type of power converter is a Switched Mode Power Supplies (SMPS). An SMPS may include a power supply unit and a circuit inside the unit to regulate the current. The regulating circuit may control the current so that it can stabilize it to a set voltage that is then sent to the electronic device. Due of weight, economic, and convenience factors, SMPS's are the devices of choice to power most consumer electronics that need stable current and voltage. However, they must be designed carefully to provide power with acceptable efficiency and minimal noise.

To meet these requirements, power converters may include one or more stages that include one or more magnetic components including filters, transformers, inductors, or the like. Many power converters are designed to provide multiple output voltages. A typical example is the desktop ATX computer power supply, which produces 12 V, 5 V, and 3.3 V as well as other supplies. The 12 V, 5 V, and 3.3 V supplies all require tight voltage regulation and must produce a large output current. In order to produce all of the desired output voltages from a single transformer, the turns-ratio of the transformer between the primary and secondary windings should match the input voltage relative to the output voltages plus any rectifier voltage drops in the output stages. In order to keep the transformer secondary turns to a minimum, some error is often introduced into the output voltages due to use of integer turns-ratios in low numbers.

As can be appreciated, it may be desirable to have relatively few secondary windings for various reasons. For example, since the voltage may be "stepped down" from the primary windings to the secondary windings (e.g., from 120 V down to 3.3 V), the turns-ratio may be very large, which requires a large number of turns for the primary windings relative to the secondary windings. Second, since the secondary windings may generally carry a relatively large amount of current, windings having a relatively large cross-section may be used, which increases the physical space required by the windings. By utilizing relatively few turns, the physical space required by the secondary windings and the primary windings may be reduced.

Some types of AC-to-DC power supplies may include isolation transformers that step a high-voltage bus (e.g. 250 V-400 V) down to one or more low-voltage, high-current outputs. The resulting large turns-ratio in the isolation transformer requires a primary winding that utilizes many turns of relatively small wire and larger, high-current secondary windings that typically contain only a few turns (e.g., less than 10-15 turns). Due to larger current requirements, the secondary windings usually have a relatively large cross-sectional area. The large cross-sectional area of the secondary windings often causes difficulty in winding the transformers and can also lead to significant high-frequency loss due to the skin effect and the proximity effect.

Due to the high current density required for high power transformers, litz wire may be utilized to wind secondary windings directly onto the bobbin. Litz wire may provide the flexibility required to maneuver the wire, but can be very costly for some applications. Additionally, the use of litz wire for multiple outputs (e.g., multiple secondary windings) requires significant hand labor and leads to poor overall copper utilization of the available space due to a large percentage of insulation in the litz wire. Additionally, the cost of manufacturing a transformer with litz wire may be relatively high and prone to manufacturing mistakes and errors.

Figure 1A:
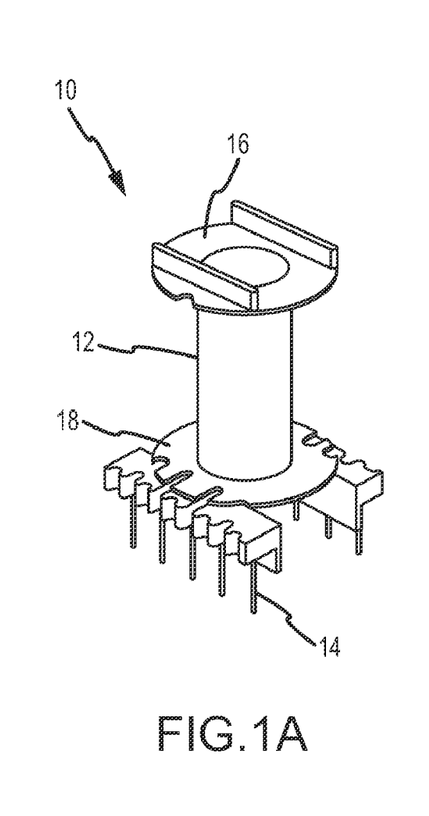
FIGS. 1A-1C illustrate a prior art EE-type transformer.
Figure 1B:
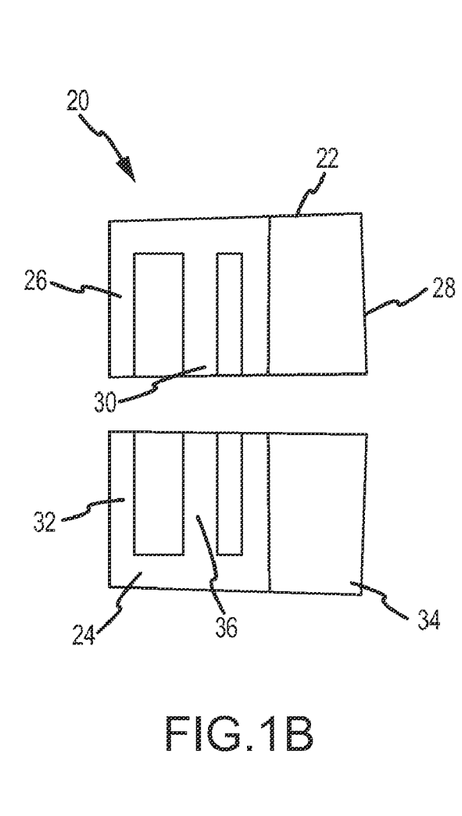
Figure 1C:
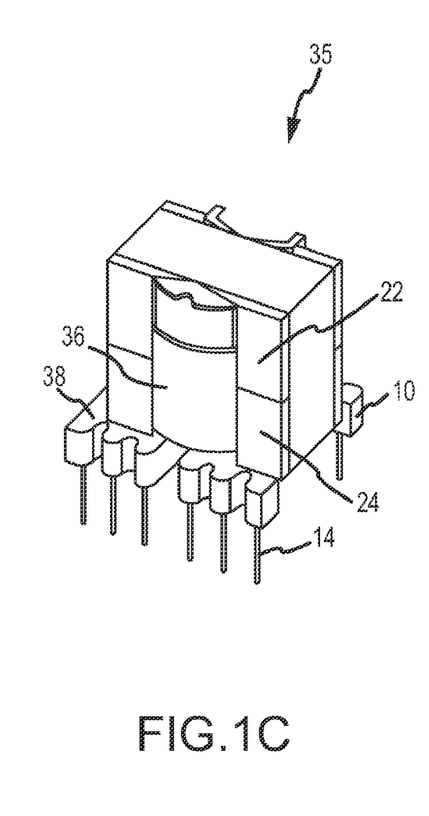

FIGS. 1A-1C illustrate a prior art EE-type core assembly 20 and bobbin 10 used to wind an EE transformer 35. The outside diameter of a rim 16 of the bobbin 10 may be approximately the same as the outer diameter of the window area of the core assembly 20. In practice, the rim 16 of the bobbin 10 may have a diameter that is slightly smaller than the window area of the core assembly 20 to insure clearance for assembly of the core assembly 20 onto the bobbin 10 to form the transformer 35. The core assembly 20 may include a top half 22 having two outer legs 26, 28, and a center leg 30 sized to be insertable into a hollow portion of the bobbin 10. The core assembly 20 may also include a bottom half 24 having two outer legs 32, 34, and a center leg 36.

The standard method of wrapping a winding (e.g., the winding wire 38 shown in FIG. 38) for the transformer 35 is to attach a wire to a bobbin pin (e.g., a pin 14), wrap the wire around a winding surface 12 of the bobbin 10 as many times as necessary to achieve the desired number of turns, and then terminate the wire on another bobbin pin. This method may be repeated for all of the windings on the transformer 35. Additionally, one or more layers of insulation material 36 may be provided around one or more of the windings for electrical isolation.

If the transformer design maximizes the use of the available window area, then the copper winding's outermost diameter may be approximately the same as the outside diameter of the rim 16 of the bobbin 10. In the case of large current-carrying secondary windings, the windings may typically be composed of litz wire or copper foil. In either case, additional termination leads may need to be added to the litz wire or to the copper foil to connect the wire to a bobbin pin. Also, in either case, the windings of the transformer may use as much of the available window area as possible.

SUMMARY

The following embodiments and aspects of thereof are described and illustrated in conjunction with systems, tools, and methods which are meant to be exemplary and illustrative, and not limiting in scope. In various embodiments, one or more of the above-described problems have been reduced or eliminated, while other embodiments are directed to other improvements.

According to a first aspect, a transformer is provided that includes a bobbin having a winding surface and hollow portion configured to receive a portion of a core assembly. The transformer also includes a first winding wrapped around the winding surface, and a second winding disposed over the winding surface. The second winding is sufficiently rigid such that it may be pre-formed prior to assembly of the transformer. The transformer also includes a core assembly disposed proximate to the bobbin, wherein a portion of the core assembly is disposed within the hollow portion of the bobbin.

According to a second aspect, a method for forming a transformer is provided. The method includes providing a bobbin including a winding surface and a hollow portion, the hollow portion configured for receiving at least a portion of a core assembly. The method also includes winding a first conductor around the winding surface of the bobbin, and pre-forming a second conductor into a coil configuration that includes one or more turns, the second conductor being sufficiently rigid such that it may substantially maintain a pre-formed shaped without external support. The method, further includes positioning the second conductor over the winding surface by passing the second conductor over one end of the bobbin, and inserting at least a portion of a core assembly into the hollow portion of the bobbin.

According to a third aspect, a transformer is provided that includes a bobbin having a winding surface, a hollow portion configured to receive a portion of a core assembly, and a plurality of pins The transformer also includes a first winding wrapped, around the winding surface, and a second winding disposed over the winding surface. The second winding is sufficiently rigid such that it may be pre-formed prior to assembly of the transformer. The transformer further includes a third winding disposed over the winding surface, the third winding being sufficiently rigid such that it may be pre-formed prior to assembly of the transformer. In addition, the second winding and the third winding are interwoven together. The transformer also includes a core assembly disposed proximate to the bobbin, wherein a portion of the core assembly is disposed within the hollow portion of the bobbin. In addition, the transformer includes a circuit board, wherein at least one of the plurality pins of the bobbin is coupled to the circuit board, and wherein at least a portion of the second winding and a portion of the third winding are coupled directly to the circuit board.

In addition to the exemplary aspects and embodiments described above, further aspects and embodiments will become apparent by reference to the drawings and by study of the following descriptions.

DETAILED DESCRIPTION

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention as defined by the claims.

The aforementioned problems and other problems are solved by the features described herein by providing transformers having bobbins that are constructed in such a way that pre-formed secondary windings (e.g., resembling springs) may be slipped onto the bobbins after a primary winding has been wound onto the bobbin. Additionally, the secondary windings may also serve as a self-leading device. That is, they may not require terminations on pins of the bobbin, which further reduces cost and complexity. The transformer winding techniques described herein may reduce the number of components, and may promote smaller input filters and/or less filtering stages at a fraction of the cost of conventional transformers.

Figure 2:
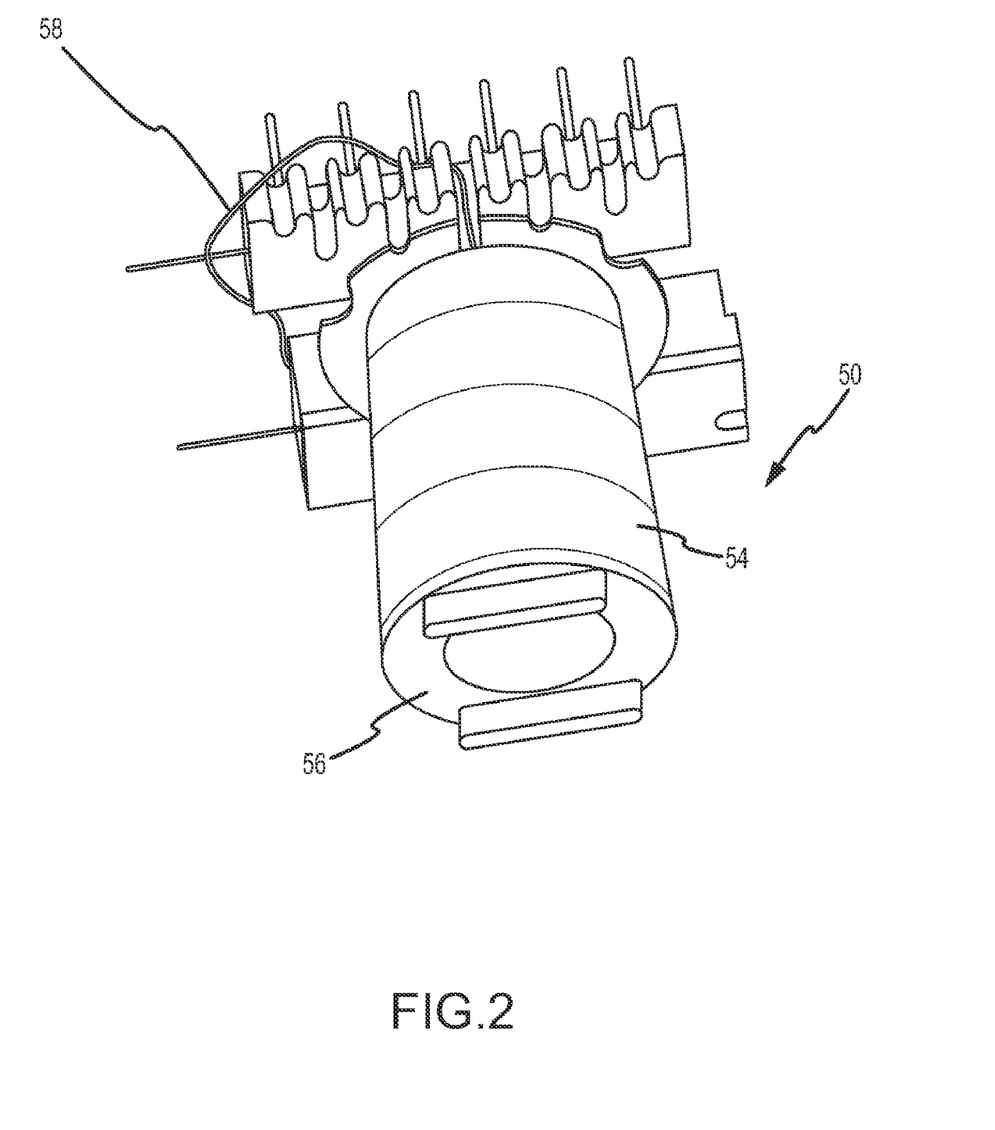
FIG. 2 illustrates an exemplary bobbin that may be included as part of a transformer.
Figure 3:
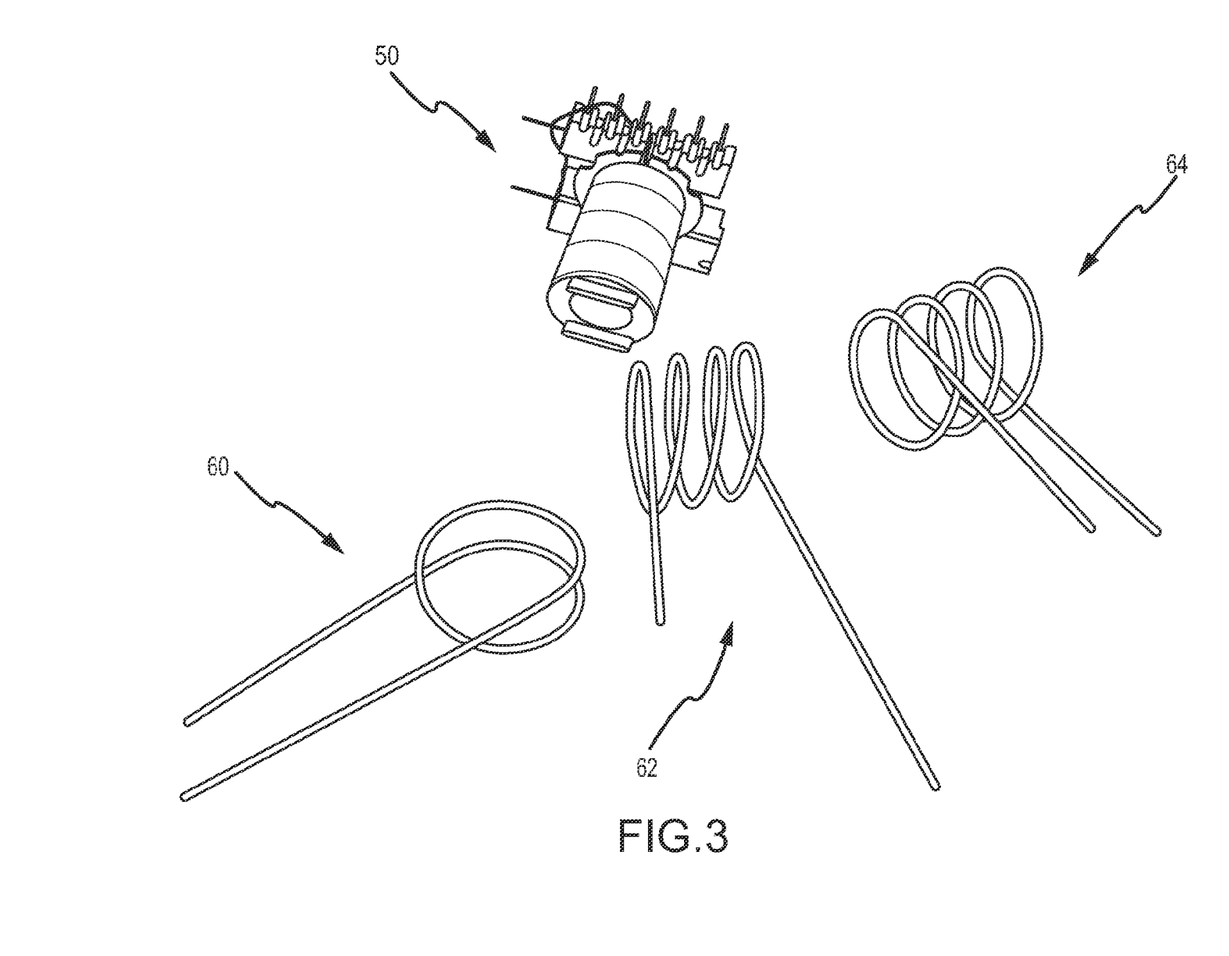
FIG. 3 illustrates a plurality of secondary windings that may be positioned over a winding surface of the bobbin shown in FIG. 2 to form a transformer.
Figure 4:
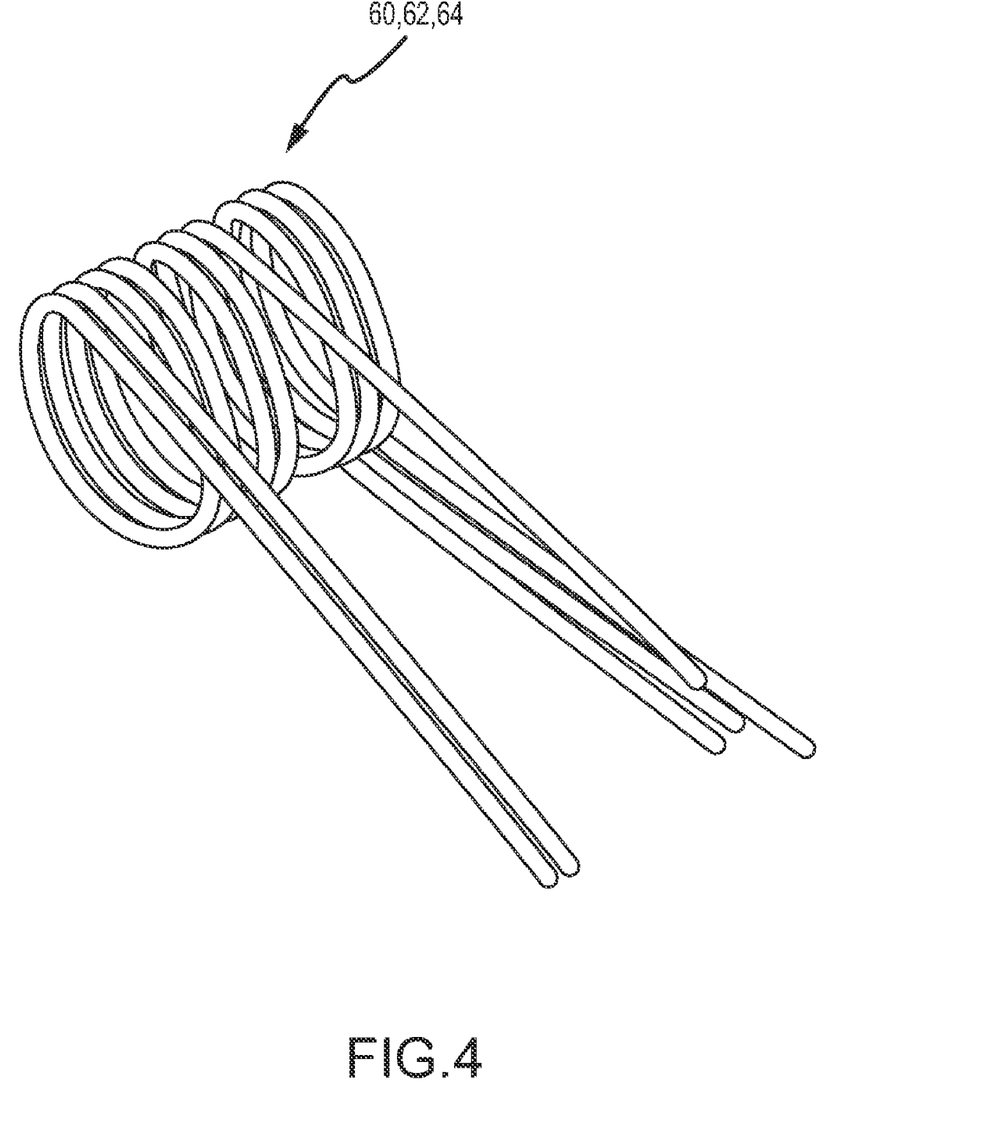
FIG. 4 illustrates the secondary windings shown in FIG. 3 after they have been interwoven or screwed together.

In an embodiment shown in FIGS. 2-4, a primary winding 58 is wound on a bobbin 50 using insulated wire, and then insulating tape 54 may be added for further insulation. It is noted that the primary winding 58 alone fills the winding surface of the bobbin 50 to a diameter that is substantially equal to the diameter of a rim 56 of the bobbin 50. That is, the diameter of the rim 56 of the bobbin 50 may be relatively small, compared to conventional bobbins.

FIG. 3 illustrates three secondary windings 60, 62, and 64 that may be used to form a transformer. The secondary windings 60, 62, 64 may be preformed as a spring (or coil) in a process separate from wrapping the primary winding 58 on the bobbin 50, thereby reducing the manufacturing time and hand labor operations required (e.g., compared to the time and labor required if litz wire was used). In this regard, the windings 60, 62, 64 may be configured to be somewhat rigid, such that they maintain their pre-formed shape without requiring an external support structure (e.g., a bobbin). Further, the secondary windings 60, 62, and 64 may be used as pins themselves to be inserted directly onto a circuit board (e.g., see FIG. 7), thereby eliminating the need to solder the windings to pins on the bobbin 50, and to then solder the pins of the bobbin 50 to a circuit board.

FIG. 3 shows the three secondary windings 60, 62, and 64 next to the bobbin 50, which already has the primary winding (e.g., the primary winding 58 shown in FIG. 2) wound onto it. The secondary windings (or springs) 60, 62, 64 may then be put together as shown in FIG. 4 by "screwing" or interweaving them together. After the secondary windings 60, 62, and 64 are coupled together, they may then be slid over the primary winding 58 that is already wound around the bobbin 50. Once the bobbin 50 and the windings 60, 62, and 64 have been assembled, a core assembly may be inserted into the hollow portions of the bobbin 50 to form a transformer.

Figure 5:
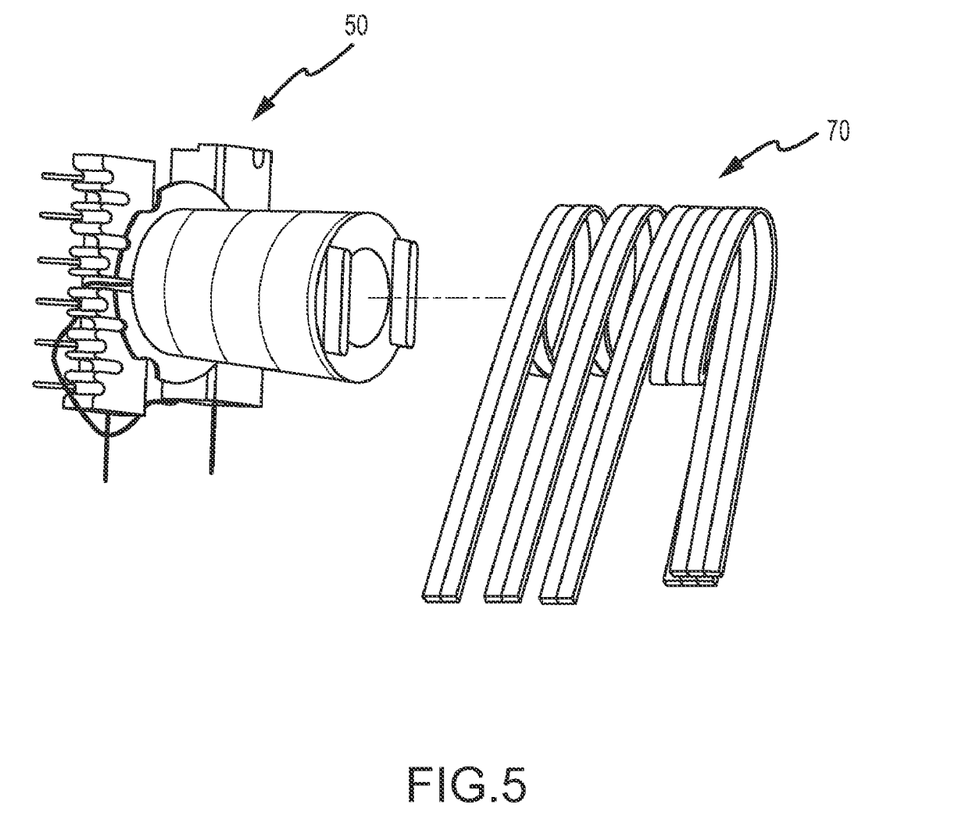
FIG. 5 illustrates a plurality of secondary windings made of a flat wire that may be included as part of a transformer.
Figure 6:
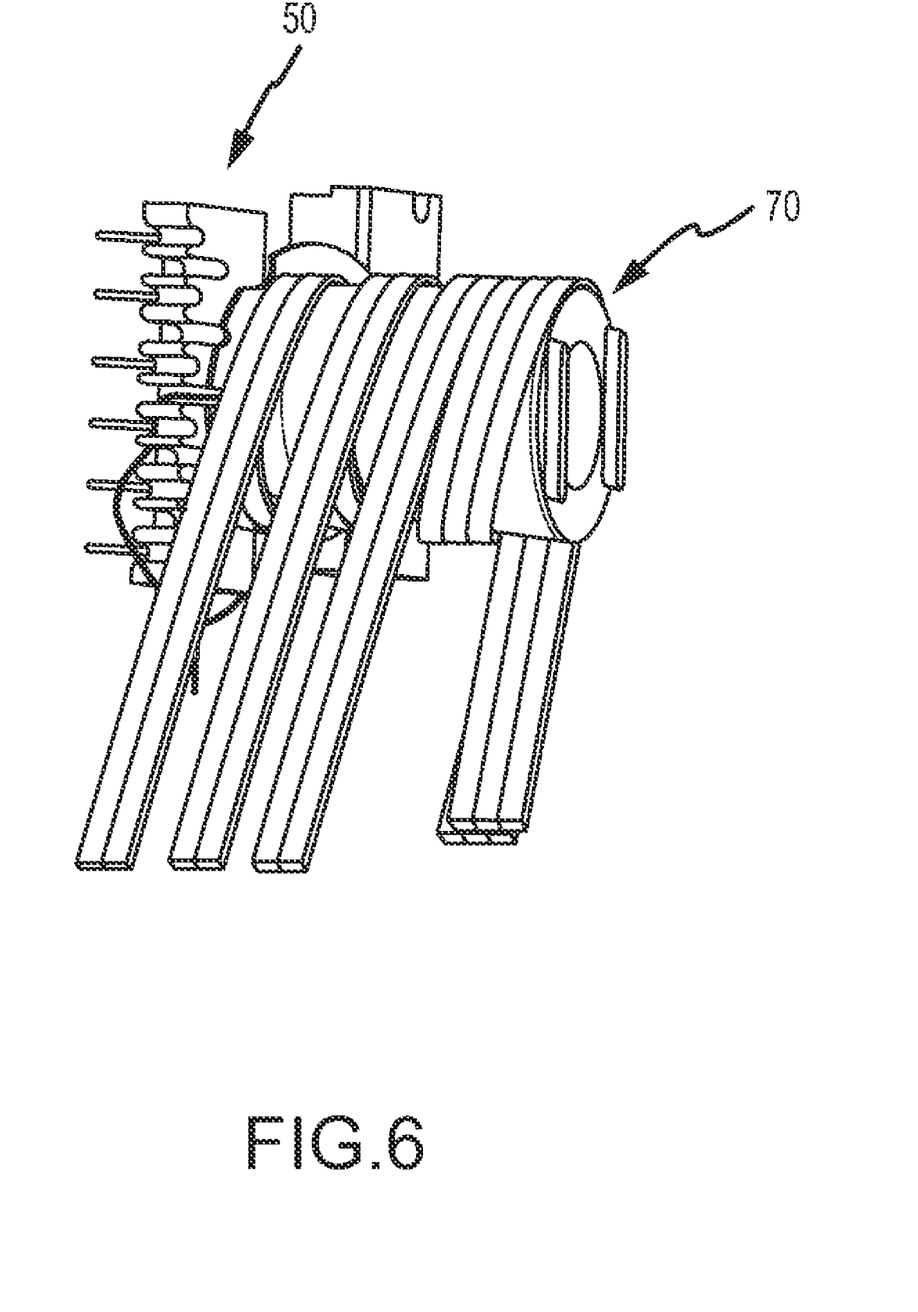
FIG. 6 illustrates the plurality of secondary windings positioned over a bobbin, both of which may be included as parts of a transformer.

FIG. 5 illustrates a plurality of strands 70 of flat wire that may also be used to form the secondary windings (or springs) for a transformer. Once the strands 70 have been pre-formed as shown in FIG. 5, they may then be slid onto the bobbin 50 on top of the primary winding, as shown in FIG. 6.

Figure 7:
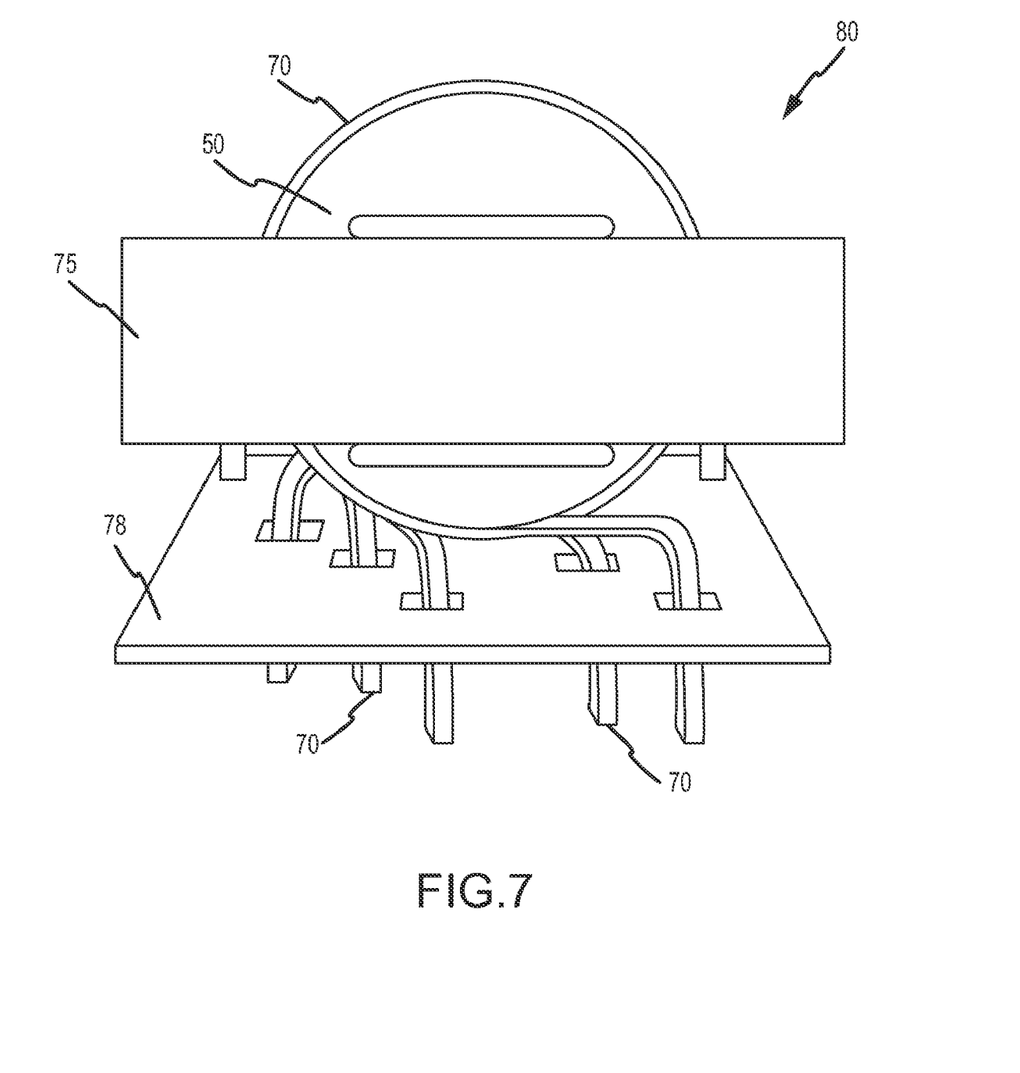
FIG. 7 illustrates an exemplary transformer.

As shown in FIG. 7, after sliding the strands 70 of secondary windings (or springs) onto the bobbin 50, an EE core 75 may be placed into the bobbin 50 and the entire structure may be soldered to a circuit board 78 to form a transformer 80. It will be appreciated that the pre-formed strands 70 of the secondary windings may be soldered directly onto the circuit board 78 without needing to utilize any pins of the bobbin 50. Of course, other types of core assemblies (e.g., EI-type core assemblies) may be used as well. Further, other types and numbers of winding may be used.

Figure 8:
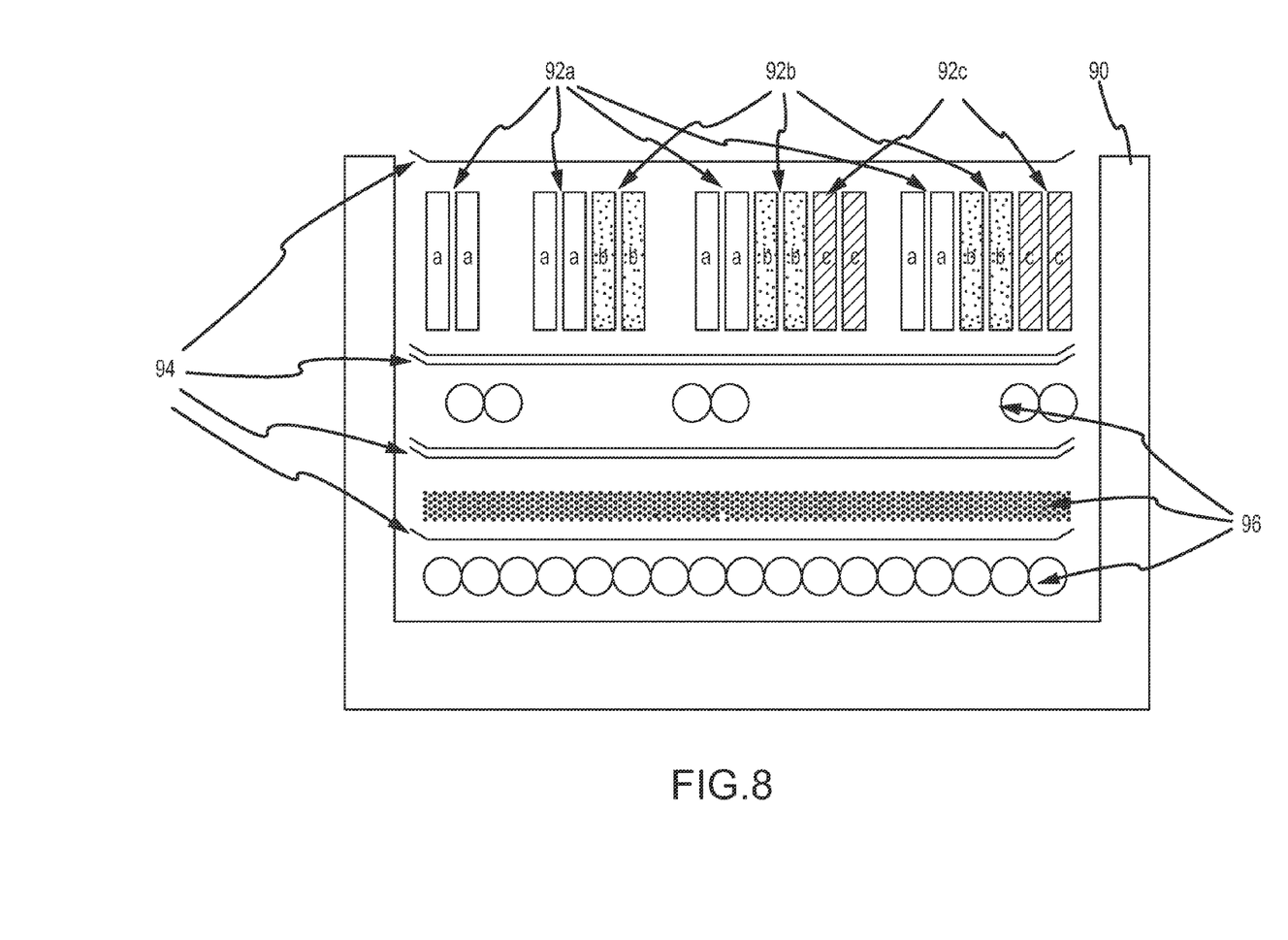
FIG. 8 illustrates a cross-sectional view of exemplary bobbin that includes primary and secondary windings.

The use of the manufacturing-friendly transformers described herein also allow the creation of winding configurations that would be very difficult to achieve if one used standard winding techniques. An example is shows in FIG. 8, which illustrates a cross-section of a window area for a bobbin 90 that may be part of a transformer. The top layer of windings 92a-c (i.e., the rectangular shaped bars) may be secondary windings, and the rows below the windings 92a-d include other winding layers 96 (e.g., other primary or secondary windings). The secondary windings 92a-c may be composed of flat wires (e.g., such as the strands 70 of flat wires shown in FIGS. 5-7) that are oriented vertically. That is, the windings 92a-c each have a cross-sectional area that has a major-axis (e.g., oriented vertically in FIG. 8) and a minor-axis (oriented horizontally in FIG. 8), and the minor-axis is parallel to the winding surface of the bobbin 90. As can be appreciated, this winding configuration may easily be achieved with the transformer construction described herein, but using conventional winding techniques, it would be very difficult to wrap the windings 92a-c in this vertical orientation directly onto the bobbin 90. In addition to the various windings, insulation layers 94 may be included to further isolate the windings from each other and/or other components.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences) Accordingly, it should be understood that only the preferred embodiment and variants thereof have been shown and described and that all changes and modifications that come within the spirit of the invention are desired to be protected.

What is claimed:

1. A method for forming a transformer, the method comprising:
   providing a bobbin comprising a winding surface and a hollow portion, the hollow portion configured for receiving at least a portion of a core assembly;
   winding a first conductor around the winding surface of the bobbin;
   pre-forming a second conductor into a first coil configuration that includes one or more turns, the second conductor being sufficiently rigid to substantially maintain the first pre-formed coil configuration without support by an external structure;
   positioning the second conductor over the winding surface by passing the second conductor over one end of the bobbin; and
   inserting at least the portion of the core assembly into the hollow portion of the bobbin.

2. The method of claim 1, further comprising:
   pre-forming a third conductor into a second coil configuration that includes one or more turns, the third conductor being sufficiently rigid to substantially maintain the second pre-formed coil configuration without support by an external structure; and
   positioning the third conductor over the winding surface by passing the third conductor over one end of the bobbin.

3. The method of claim 2, further comprising:
   interweaving the second conductor and the third conductor together prior to positioning the second conductor and the third conductor over the winding surface.

4. The method of claim 1, further comprising:
   positioning an insulating layer over the winding surface between the first conductor and the second conductor.

5. The method of claim 1, wherein the core assembly includes two E-shaped sections.

6. The method of claim 1, wherein the core assembly include an E-shaped section and an I-shaped section.

7. The method of claim 1, further comprising:
   coupling a first end and a second end of the second conductor to a circuit board.

8. The method of claim 1, wherein the coupling step includes soldering the first end and the second end of the second conductor to the circuit board.

9. The method of claim 1, wherein the second conductor has a non-circular cross-sectional area.

10. The method of claim 9, wherein the cross-section of the second conductor has a major axis and a minor axis, and wherein the pre-forming step comprises:
    forming the second conductor into a coil such that the minor axis is substantially parallel to the winding surface when the second conductor is positioned over the winding surface.

11. The method of claim 9, further comprising:
    pre-forming a third conductor into a second coil configuration that includes one or more turns, the third conductor being sufficiently rigid to substantially maintain the second pre-formed coil configuration without support by an external structure, the third conductor having a non-circular cross-sectional area; and
    interweaving the second conductor and the third conductor together prior to positioning the second conductor and the third conductor over the winding surface.

* * * * *